United States Patent
Foster et al.

(10) Patent No.: US 8,551,820 B1
(45) Date of Patent: Oct. 8, 2013

(54) ROUTABLE SINGLE LAYER SUBSTRATE AND SEMICONDUCTOR PACKAGE INCLUDING SAME

(75) Inventors: Donald Craig Foster, Mesa, AZ (US); Ronald Patrick Huemoeller, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 617 days.

(21) Appl. No.: 12/568,041

(22) Filed: Sep. 28, 2009

(51) Int. Cl.
*H01L 21/44* (2006.01)
*H01L 23/495* (2006.01)

(52) U.S. Cl.
USPC ............ 438/123; 438/617; 257/666; 257/676; 257/784; 257/E23.031

(58) Field of Classification Search
USPC .................. 257/690, 666, 676, 784, E23.031; 438/123, 617
See application file for complete search history.

(56) References Cited

U.S. PATENT DOCUMENTS

| | | | |
|---|---|---|---|
| 5,976,912 A * | 11/1999 | Fukutomi et al. | 438/110 |
| 6,031,291 A * | 2/2000 | Sato et al. | 257/774 |
| 6,255,740 B1 * | 7/2001 | Tsuji et al. | 257/792 |
| 6,306,685 B1 | 10/2001 | Liu et al. | |
| 6,351,025 B1 | 2/2002 | Ohsawa et al. | |
| 6,384,472 B1 | 5/2002 | Huang et al. | |
| 6,451,627 B1 | 9/2002 | Coffman | |
| 6,476,469 B2 | 11/2002 | Hung et al. | |
| 6,713,322 B2 * | 3/2004 | Lee | 438/123 |
| 6,872,661 B1 * | 3/2005 | Kwan et al. | 438/689 |
| 7,102,214 B1 | 9/2006 | Miks et al. | |
| 7,153,724 B1 | 12/2006 | Sirinorakul et al. | |
| 7,247,938 B2 | 7/2007 | Groenhuis | |
| 7,348,663 B1 * | 3/2008 | Kirloskar et al. | 257/704 |
| 2007/0093000 A1 | 4/2007 | Shim et al. | |

OTHER PUBLICATIONS

Donald C. Foster. U.S. Appl. No. 60/844,222 entitled "Molded Lead Frame Strip for Dual and Quad Flat No Lead Semiconductor Packages".

* cited by examiner

*Primary Examiner* — Nitin Parekh

(57) ABSTRACT

In accordance with the present invention, there is provided a routable substrate that may be used, for example, in relation to the manufacture of Dual and Quad Flat No-Lead (DFN/QFN) style semiconductor packages as a substrate or interposer of such packages. The method of fabricating the substrate effectively removes metal from the saw streets and provides a more stable surface structure for wire bonding. The substrate fabrication method also utilizes existing etching techniques which are implemented in a prescribed sequence to achieve no metal in the saw streets and to completely electrically isolated features. Further, the substrate fabrication method includes a molding step intended to replace pressure sensitive adhesive tapes.

19 Claims, 6 Drawing Sheets

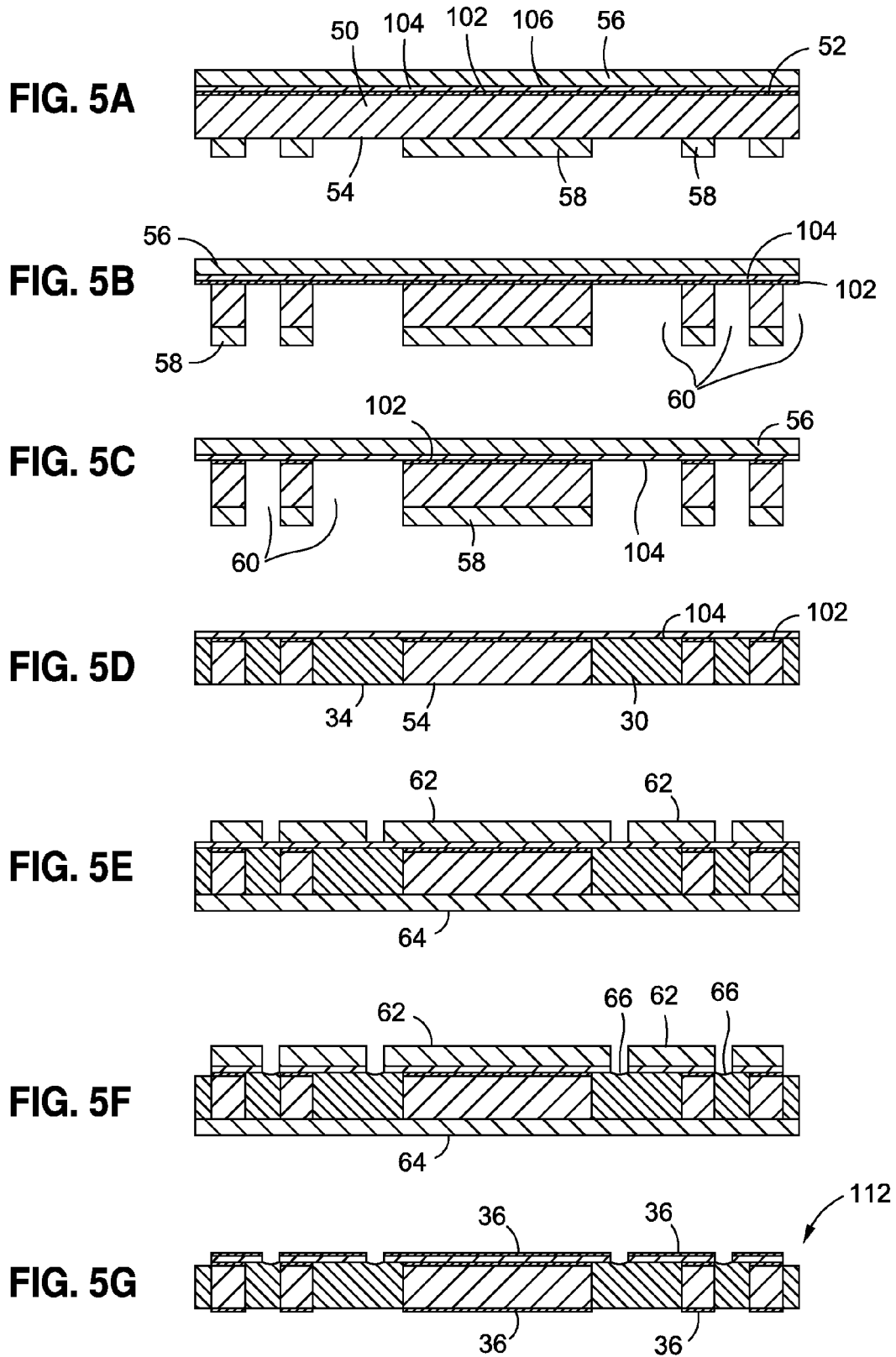

FIG. 7A
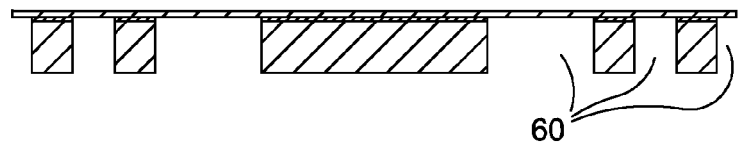
FIG. 7B
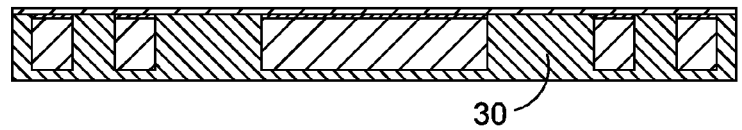
FIG. 7C
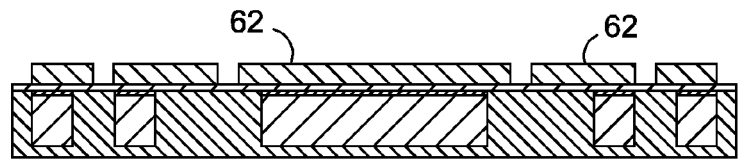
FIG. 7D
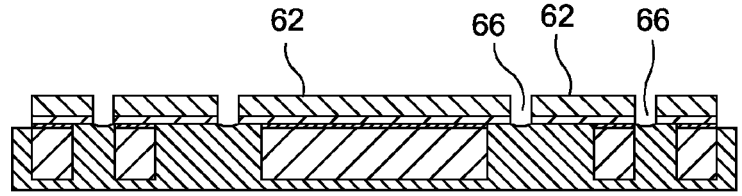
FIG. 7E
FIG. 7F
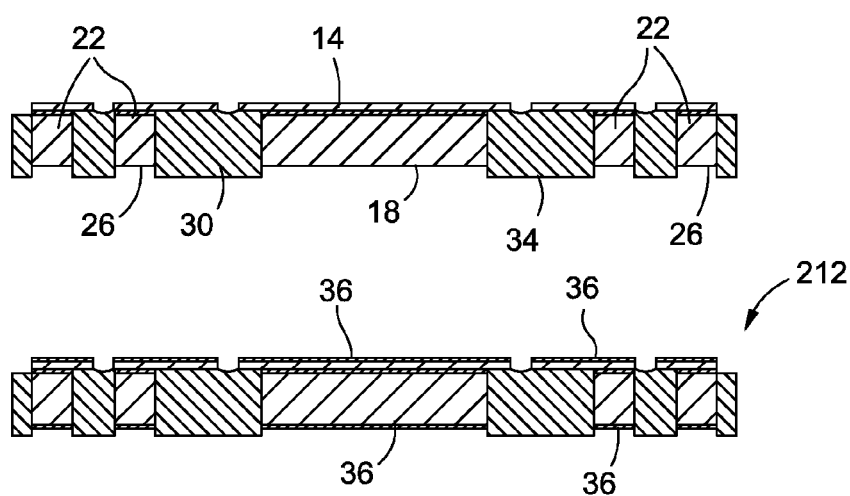

ROUTABLE SINGLE LAYER SUBSTRATE AND SEMICONDUCTOR PACKAGE INCLUDING SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of Invention

The present invention relates generally to integrated circuit packaging and, more particularly, to a low cost routable substrate that overcomes wire length, die size, and high cost constraints typically found in other solutions such as TAPP (thin array plastic package), HMT, WPLGA and tsCSP (thin substrate chip scale package), and may used in relation to the manufacture of Dual and Quad Flat No-Lead (DFN/QFN) style semiconductor packages as a substrate or interposer of such packages.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal lead frame, an integrated circuit or semiconductor die, bonding material to attach the semiconductor die to the lead frame, bond wires which electrically connect pads on the semiconductor die to individual leads of the lead frame, and a hard plastic encapsulant material which covers the other components and forms the exterior of the semiconductor package commonly referred to as the package body.

The lead frame is the central supporting structure of such a package, and is typically fabricated by chemically etching or mechanically stamping a metal strip. A portion of the lead frame is internal to the package, i.e., completely surrounded by the plastic encapsulant or package body. Portions of the leads of the lead frame extend externally from the package body or are partially exposed therein for use in electrically connecting the package to another component.

For purposes of high-volume, low-cost production of semiconductor packages, a current industry practice is to etch or stamp a thin sheet of metal material to form a panel or strip which defines multiple lead frames. A single strip may be formed to include multiple arrays, with each such array including a multiplicity of lead frames in a particular pattern. In a typical semiconductor package manufacturing process, the integrated circuit dies are mounted and wire bonded to respective ones of the lead frames, with the encapsulant material then being applied to the strip so as to encapsulate the integrated circuit dies, bond wires, and portions of each of the lead frames in the above-described manner. Upon the hardening of the encapsulant material, the lead frames within the strip are cut apart or singulated for purposes of producing the individual semiconductor packages. Such singulation is typically accomplished via a saw singulation process. In this process, a saw blade is advanced along "saw streets" which extend in prescribed patterns between the lead frames as required to facilitate the separation of the lead frames from each other in the required manner.

With particular regard to DFN/QFN style semiconductor packages, current methods used to manufacture saw singulated DFN/QFN semiconductor packages involve the use of a lead frame to which integrated circuits or die are mounted using epoxy. Once the die or integrated circuit(s) is/are mounted to the lead frame, the interconnections between the die and the leads of the lead frame are typically made using thermosonic gold ball bonding methods. The integrated circuits are then encapsulated using epoxy mold compound. After encapsulation, the integrated circuits are singulated using a sawing process as described above.

These DFN/QFN packages typically utilize a copper based lead frame in which the pattern representing the leads and die attach pad or die pad (to which the die is typically attached) are etched. The leads and die pad each usually contain design features that aid in locking to the epoxy mold encapsulant or package body. For example, locking features found on a lead are typically created by selectively half etching portions of the bottom side of the lead. This creates a lead structure in which the top portion is substantially larger than the bottom portion. When encapsulated, this prevents the lead from being pulled out of the package during expected use conditions.

As also indicated above, individual units are normally arranged in an array pattern to maximize the number of units on a strip. All the units in the strip are held together by use of common copper features called a connecting bar that is later removed during the package singulation process. To aid in manufacturing, temperature resistant tape is usually mounted to the bottom side of the strip. This tape helps stabilize the strip during the wire bonding process by allowing vacuum clamping. The tape also prevents mold flash from occurring during encapsulation.

There are several drawbacks to this tape based lead frame structure. First, the connecting bars that hold the units together in the strip must be removed during the singulation process. The diamond abrasive blades typically used must saw through both the encapsulant and the metal connecting bars. Because of the metal, this requires a slower cutting speed and decreases blade life. By removing metal from the singulation path, saw speed and blade life can be increased and result in lower costs.

Second, the use of tape to help stabilize the leads for wire bonding does impose limitations on what can be bonded to. For example, the leads usually have half etch features on top of the leads but no supporting metal structure underneath. Because there is normally a gap between the tape and these features, these features cannot be bonded to due to lack of physical support underneath. This generally limits bonding to areas of full metal thickness that are supported directly underneath by tape.

Third, the requirement for all design features such as leads, die pads, etc., to be connected together prevents electrical testing the individual units in strip form without additional manufacturing complexities required to electrically isolate the leads. For example, in conventional tape based DFN/QFN lead frames, an isolation saw cut is required to isolate the leads from the connecting bars, but without cutting through the full thickness. A means of creating electrically isolated leads in a strip design without adding manufacturing complexity would create advantages in electrical testing in strip form.

Finally, routable versions of TAPP, WPLGA and tsCSP all utilize a plate-up process over a dielectric to create such routable version. All of these versions require a sacrificial layer that is removed after the package body molding step.

While they can accomplish the need for routing, they are all high cost solutions due to the additive process used.

The present invention, as described below, provides a low cost routable substrate that addresses the various drawbacks discussed above which are typically found in other solutions such as TAPP, HMT, WPLGA and tsCSP, and may used in relation to the manufacture of Dual and Quad Flat No-Lead (DFN/QFN) style semiconductor packages as a substrate or interposer of such packages

BRIEF SUMMARY OF THE INVENTION

In accordance with the present invention, there is provided a routable substrate that may be used, for example, in relation to the manufacture of Dual and Quad Flat No-Lead (DFN/QFN) style semiconductor packages as a substrate or interposer of such packages. The method of fabricating the substrate effectively removes metal from the saw streets and provides a more stable surface structure for wire bonding. The substrate fabrication method also utilizes existing etching techniques which are implemented in a prescribed sequence to achieve no metal in the saw streets and to completely electrically isolated isolate features. Further, the substrate fabrication method includes a molding step intended to replace pressure sensitive adhesive tapes.

The fundamental process used in relation to the fabrication of the substrate is a subtractive etch process rather than an additive process. The starting strip is half etched on the bottom side to create the bottom land pattern, with the space where the metal is removed being filled with a dielectric material (molded, screened or vacuum laminated film). This allows the top side metal to be patterned independently of the bottom land pattern, further allowing for routing capability, albeit single layer. The different strip metal stack-ups are included to help better control the top metal thickness, which is directly related to lines and space etching capability. In this regard, the thinner the metal, the finer the line/space capability. Along these lines, with the use of an electroless plating process such as ENEPIG, plating busses can be completely eliminated, which enhances the design capability of the substrate for higher pin counts. However, it is contemplated that plating busses can still be included in the substrate fabricated in accordance with the present invention if an electrolytic process is desired. Just the same, the removal of the plating busses is typically desirable due to the resultant elimination of metal from the saw streets between semiconductor packages, such metal elimination allowing for a faster singulation process and assembly.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIGS. 5A-5G show an exemplary sequence of manufacturing steps which may be used to create the substrate of the second embodiment of the present invention;

FIGS. 7A-7F show an exemplary sequence of manufacturing steps which may be used to create the substrate of the third embodiment of the present invention.

Common reference numerals are used throughout the drawings and detailed description to indicate like elements.

DETAILED DESCRIPTION OF THE INVENTION

Figure 1:
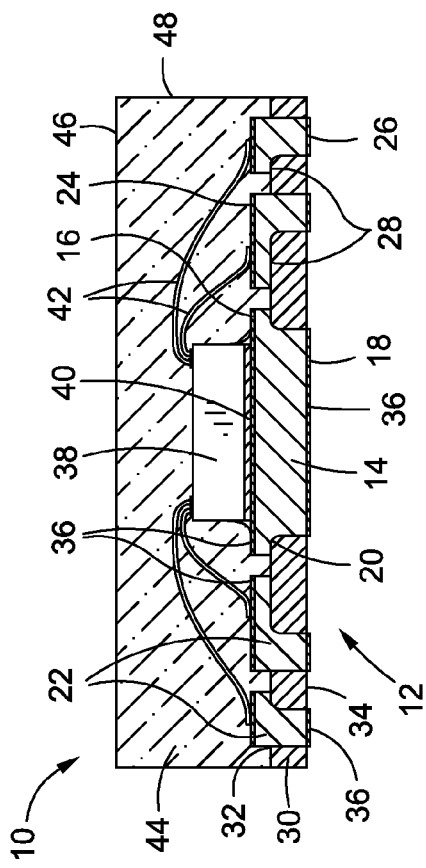
FIG. 1 shows an assembled and singulated semiconductor package including a routable substrate constructed in accordance with a first embodiment of the present invention.

Referring now to the drawings wherein the showings are for purposes of illustrating preferred embodiments of the present invention only, and not for purposes of limiting the same, FIG. 1 shows an assembled and singulated semiconductor package 10 (e.g., a DFN/QFN semiconductor package) including a routable substrate 12 constructed in accordance with a first embodiment of the present invention. The substrate 12 of the semiconductor package 10 includes a die pad 14 which has a generally quadrangular (e.g., square) configuration. When viewed from the perspective shown in FIG. 1, the die pad 14 defines a generally planar top surface 16 and an opposed, generally planar bottom surface 18. Additionally, the die pad 14 is formed such that the overall area of the top surface 16 exceeds that of the bottom surface 18, such differing areas being attributable to the formation of the die pad 14 so as to include a shelf or shoulder 20 which is recessed relative to and circumvents the bottom surface 18.

In addition to the die pad 14, the substrate 12 includes a plurality of leads 22. In the exemplary semiconductor package 10 shown in FIG. 1, the leads 22 are segregated into an inner set which at least partially circumvents and is disposed in spaced relation to the peripheral edge of the die pad 14, and an outer set which at least partially circumvents and is disposed in spaced relation to the inner set. However, those of ordinary skill in the art will recognize that the preferred fabrication methodology for the substrate 12 which will be described in more detail below may be implemented such that the leads 22 are provided in any one of a multiplicity of differing patterns or arrangements.

In the substrate 12, each of the leads 22, when viewed from the perspective shown in FIG. 1, defines a generally planar top surface 24 and an opposed, generally planar bottom surface 26. In addition, each of the leads 22 defines a shelf or shoulder 28 which is recessed relative to the bottom surface 26, and disposed in generally opposed relation to a portion of the top surface 24. As is also apparent from FIG. 1, the length of the shoulder 28 of each of the leads 22 of the inner set exceeds the length of the shoulder 28 of each of the leads 22 of the outer set. In this regard, while the leads 22 of the inner set are identically configured to each other and the leads 22 of the outer set are identically configured to each other, the leads 22 of the inner and outer sets are dissimilarly configured as a result of the differing lengths of the shoulders 28 as described above. In the substrate 12, it is contemplated that the portion of each of the leads 22 defining the shoulder 28 may serve as a trace for routing purposes. In this regard, the traces of one or more leads 22 of the outer set may be configured such that they may be used to route from the outer set, between leads 22 of the inner set, and toward the die pad 14.

As is further seen in FIG. 1, the substrate 12 further comprises a substrate body 30 which is formed so as to fill the gaps or voids between the individual leads 22, and between leads 22 (i.e., the leads 22 of the inner set) and the die pad 14. The substrate body 30 also protrudes slightly beyond the outer ends of the leads 22 of the outer set. The substrate body 30 is also formed so as to cover the shoulder 20 of the die pad 14, and the shoulders 28 defined by the leads 22. Though the substrate body 30 covers the shoulders 20, 28, a top surface 32 of the substrate body 30 (when viewed from the perspective shown in FIG. 1) is recessed relative to the top surface 16 of the die pad 14 and the top surfaces 24 of the leads 22. However, a bottom surface 34 of the substrate body 30, which is disposed in opposed relation to the top surface 32, extends in generally co-planar relation to the bottom surface 18 of the die pad 14 and the bottom surfaces 26 of the leads 22. The substrate body 30 is preferably fabricated from a dielectric material in a molding, screening or other process as will be described in more detail below.

In the substrate 12, the top and bottom surfaces 16, 18 of the die pad 14 and the top and bottom surfaces 24, 26 of each of the leads 22 each preferably include a conductive metal plating layer 36 formed thereon. The plating layers 36 formed on the bottom surface 18 of the die pad 14 and the bottom surfaces 26 of the leads 22 protrude slightly relative to the bottom surface 34 of the substrate body 30. The plating layers 36 are preferably formed by an electroless plating process as will also be described in more detail below.

In addition to the substrate 12, the semiconductor package 10 comprises an integrated circuit or semiconductor die 38 which is attached to the top surface 16 of the die pad 14, and more particularly to the plating layer 36 formed thereon. The attachment of the semiconductor die 38 to the die pad 14 is preferably facilitated through the use of a layer 40 of a die attach material or adhesive. Disposed on that surface of the semiconductor die 38 opposite the surface placed against the adhesive layer 40 is a plurality of conductive contacts or terminals. These terminals are electrically connected to respective ones of the leads 22 through the use of conductive wires 42. More particularly, one end of each conductive wire 42 is bonded to a respective one of the terminals of the semiconductor die 38, with the opposite end of such conductive wire 42 being bonded to the plating layer 36 formed on the top surface 24 of a respective one of the leads 22. In this regard, a thermosonic ball bonding process may used to create the wire bonds that interconnect the semiconductor die 38 to the leads 22 through the use of the conductive wires 42.

The semiconductor package 10 further comprises a package body 44 which is formed as a result of the hardening of an encapsulant material applied to the semiconductor die 38, the conductive wires 42, and a portion of the substrate 12. The package body 44, which is typically formed through the implementation of a transfer molding process, has a generally quadrangular configuration, and defines a generally planar top surface 46 (when viewed from the perspective shown in FIG. 1), and generally planar side surfaces 48 which extend generally perpendicularly relative to the top surface 46 in substantially flush relation to the peripheral edge of the substrate body 30 of the substrate 12. The package body 44 covers the top surface 32 of the substrate body 30, those portions of the leads 22 protruding from the top surface 32 of the substrate body 30, the semiconductor die 38 and conductive wires 42.

In the semiconductor package 10, the die pad 14 and leads 22 of the substrate 12 are effectively held in place by the substrate body 30. The plating layers 36 disposed on the top surfaces 24 of the leads 22 support the wire bonded interconnections to the semiconductor die 38 as defined by the conductive wires 42. Though not shown in FIG. 1, it is contemplated that one or more terminals of the semiconductor die 38 may be electrically connected to the die pad 14, and more particularly to the plating layer 36 disposed on the top surface 16 thereof through the use one or more conductive wires 42 to act as grounds. The external plated surfaces defined by the plating layers 36 formed on the bottom surface 18 of the die pad 14 and the bottom surfaces 26 of the leads 22 provide solderable surfaces which allow the semiconductor package 10 to be soldered to an underlying substrate such as a printed circuit board.

Having thus described the structural attributes of the semiconductor package 10 shown in FIG. 1, a preferred method of fabricating the substrate 12 thereof will now be described with specific reference to FIGS. 3A-3G.

In the initial step of the fabrication process for the substrate 12, a starting leadframe strip 50 is provided, the strip 50 preferably being fabricated from copper, copper alloy, or any other commonly used metal alloys for leadframes. When viewed from the perspective shown in FIG. 3A, the strip 50 defines a generally planar top surface 52, and an opposed, generally planar bottom surface 54. An etch resistant mask 56 is applied to the top surface 52 of the strip 50, with a photoimagable etch mask 58 being applied to the bottom surface 54 of the strip 50. The mask 56 completely protects the entire top surface 52 of the strip 50 from a subsequent etching step described below. The mask 58 is imaged and developed to facilitate the formation of a bottom land pattern which will ultimately be defined by the bottom surface 18 of the die pad 14 and the bottom surfaces 26 of the leads 22 of the substrate 12. The top etch resistant mask 56 is not required to be photosensitive as the top lead pattern of the substrate 12 is not defined until a subsequent fabrication step also described below. As is apparent from FIG. 3A, as a result of the photoimagable etch mask 58 being imaged and developed, openings are formed therein, with those areas of the bottom surface 54 of the strip 50 still covered by the mask 58 ultimately defining the bottom surface 18 of the die pad 14 and the bottom surfaces 26 of the leads 22 as indicated above.

Figure 3A:
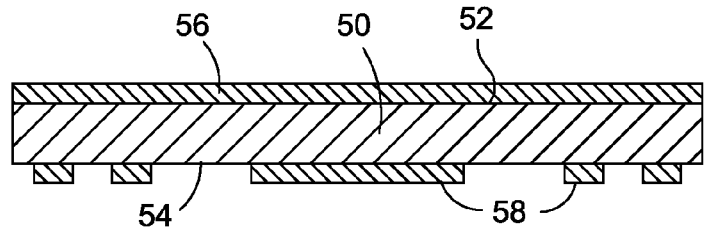
FIGS. 3A-3G depict an exemplary sequence of manufacturing steps which may be used to create the substrate of the first embodiment of the present invention.
Figure 3B:
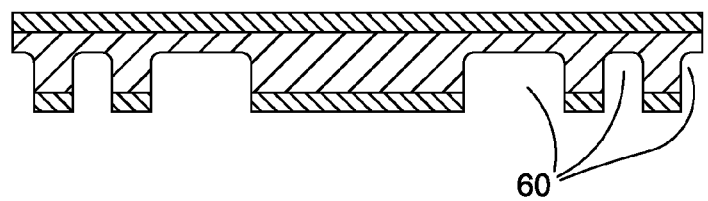

In the next step of the fabrication process for the substrate 12 shown in FIG. 3B, a single side etching of the bottom surface 54 of the strip 50 within the openings defined by the imaged and developed etch mask 58 is performed to a controlled depth to facilitate the creation of prescribed half etch areas or recesses 60 in the bottom surface 54 of the strip 50. This etching process can be a typical acid or alkaline etch process as commonly used in the industry. FIG. 3B shows the resulting half etch areas or recesses 60 that result from the completion of the this initial etching step, the pattern of such recesses 60 being attributable to the aforementioned openings in the bottom etch mask 58. As indicated above, this initial etching process is completed such that the depth of each recess 60 is controlled to a specific tolerance.

Figure 3C:
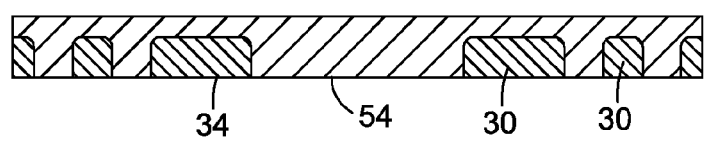

In the next step of the fabrication process for the substrate 12 shown in FIG. 3C, the etch resistant mask 56 and the photoimagable etch mask 58 are each removed from the strip 50. Thereafter, the etched areas or recesses 60 formed in the strip 50 as a result of the aforementioned etching process are filled with a dielectric material (e.g., an epoxy material)

which ultimately hardens into the above-described substrate body 30. By way of example and not by way of limitation, transfer molding using standard thermoset mold compounds may be used to facilitate the filling of the recesses 60 with the dielectric material. Other suitable methods for facilitating the filling of the recesses 60 with the dielectric material include screening, or the use of vacuum laminated film. The dielectric material filled into the recesses 60 bonds to the etched surfaces defining the same and, upon hardening into the substrate body 30, will ultimately provide a stable structure to support the die pad 14 and the leads 22 of the completed substrate 12. As is further apparent from FIG. 3C, the dielectric material is filled into the recesses 60 to a depth such that, upon the hardening thereof into the substrate body 30, the bottom surface 34 of the substrate body 30 extends in generally co-planar relation to those portions of the bottom surface 54 of the strip 50 previously covered by the etch mask 58. As will be recognized by those of ordinary skill in the art, the removal of the masks 56, 58 and hardening of the dielectric material filled into the recesses 60 into the substrate body 30 results in the exposed, unetched portions of the bottom surface 54 of the strip 50 defining what will ultimately become the bottom surface 18 of the die pad 14 and bottom surfaces 26 of the leads 22 of the substrate 12. Though not shown, it is contemplated that following the molding step described above, additional steps may be used to facilitate the removal of any mold flash from upon the unetched portions of the bottom surface 54 of the strip 50. Such mold flash removal methods may involve the use of mechanical or chemical techniques, or a combination of both, as are well known in the art.

Figure 3D:
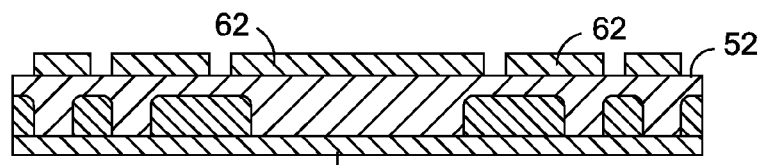

Referring now to FIG. 3D, in the next step of the fabrication process for the substrate 12, a photoimagable etch mask 62 is applied to the unetched top surface 52 of the strip 50. An etch resistant mask 64 is applied to the bottom surface 34 of the substrate body 30, and to the unetched portions of the bottom surface 54 of the strip 50. The top mask 62 is imaged and developed in a pattern as will ultimately facilitate the formation of the die pad 14 and leads 22 of the substrate 12 in a desired arrangement. As is apparent from FIG. 3D, as a result of the mask 62 being imaged and developed, openings are formed therein, with those areas of the top surface 52 of the strip 50 still covered by the imaged and developed mask 62 ultimately defining the top surface 16 of the die pad 14 and the top surfaces 24 of the leads 22. The etch resistant mask 64 is used to protect the exposed lands defined by the unetched portions of the bottom surface 54 of the strip 50, and further to protect the bottom surface 34 of the substrate body 30 formed by the hardening of the dielectric material filled into the recesses 60. Advantageously, in the process of fabricating the substrate 12, the bottom pattern formed by the imaging and development of the mask 58 and the top pattern formed by the imaging and development of the mask 62 are independent of each other, allowing for the routing of signal traces as may ultimately be defined by the leads 22 in the completed substrate 12 in a prescribed manner.

Figure 3E:
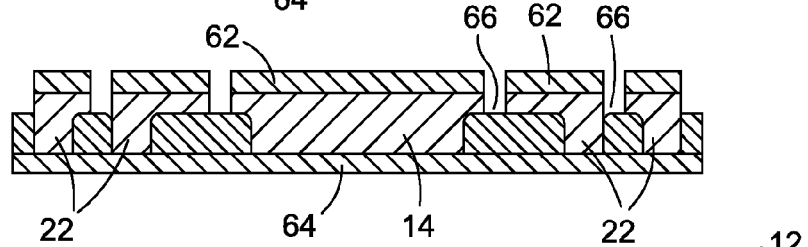

In the next step of the fabrication process for the substrate 12 shown in FIG. 3E, a single side etching of the top surface 52 of the strip 50 within the openings defined by the imaged and developed etch mask 62 is performed, such etching process facilitating the creation of voids or recesses 66 within the top surface 52 of the strip 50. As seen in FIG. 3E, each of the recesses 66 extends from the top surface 52 of the strip 50 to the substrate body 30. As is further apparent from FIG. 3E and as will be recognized by those of ordinary skill in the art, the completion of this second etching process in turn facilitates the complete formation of the die pad 14 and leads 22 of the substrate 12.

Figure 3F:
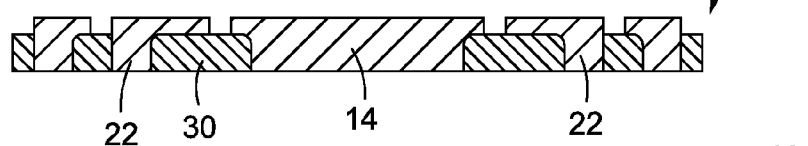

Referring now to FIG. 3F, in the next step of the fabrication process for the substrate 12, the mask 62 is removed from the now fully formed die pad 14 and leads 22. As will be recognized, the removal of the mask 62 effectively exposes the top surface 16 of the die pad 14 and the top surfaces 24 of the leads 22. In addition to the removal of the mask 62, the etch resistant mask 64 is removed from the bottom surface 34 of the substrate body 30 and the bottom surfaces 18, 26 of the now fully formed die pad 14 and leads 22. Upon the removal of the masks 62, 64, the substrate 12 is cleaned to facilitate the preparation thereof for final plating finish. As will be recognized, upon the completion of the second etching process which effectively facilitates the formation of the die pad 14 and leads 22, the substrate body 30 provides the required mechanical support for the die pad 14 and leads 22, thus serving as a stable support structure within the substrate 12.

Figure 3G:
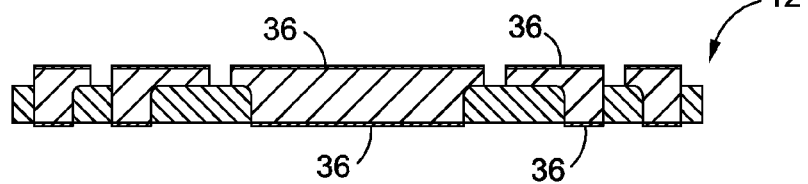

Referring now to FIG. 3G, in the final step of the fabrication process for the substrate 12, an Electroless Ni/Electroless Pd/Immersion Au plating process (ENEPIG) is simultaneously performed on both the top surfaces 16, 24 and bottom surfaces 18, 26 of the die pad 14 and leads 22. The completion of this process creates the above-described plating layers 36 on the top surfaces 16, 24 and bottom surfaces 18, 26 of the die pad 14 and leads 22. The Ni/Pd/Au plating layers 36 formed on the top surfaces 16, 24 are suitable for wire bonding or flip chip solder reflow attach. The Ni/Pd/Au plating layers 36 formed on the bottom surfaces 18, 26 are suitable for soldering during component mounting.

As is apparent from FIGS. 1 and 3G, due to the manner in which the strip 50 is etched to facilitate the formation of the recesses 60, 66 therein, the die pad 14 is caused to define the shoulder 20, with each of the leads 22 being caused to define a respective one of the shoulders 28 and thus a trace which, as indicated above, may be configured for routing from one or more leads 22 of the outer set, between leads 22 of the inner set, and toward the die pad 14. Due to the filling of the recesses 60 with the dielectric material prior to the formation of the recesses 66, the shoulders 20, 28 defined as a result of the formation of the recesses 66 are completely covered by the substrate body 30, which assists in maintaining a firm mechanical interlock of the die pad 14 and leads 22 thereto. Thus, in addition to maintaining the die pad 14 and leads 22 in electrical isolation from each other, the substrate body 30 of the substrate 12 provides a stable support structure for the die pad 14 and leads 22.

As will be recognized by those of ordinary skill in the art, once the fabrication of the substrate 12 is completed in accordance with the showing in FIG. 3G, the fabrication of the semiconductor package 10 is facilitated by attaching the semiconductor die 38 to the plating layer 36 formed on the top surface 16 of the die pad 14 in the above-described manner, and thereafter facilitating the electrical connection of the terminals of the semiconductor die 38 to the leads 22 alone or in combination with the die pad 14 through the use of the aforementioned conductive wires 42. Subsequent to the completion of these die attach and wire bonding steps, the above-described package body 44 is formed through the use of, for example, a transfer molding process. Though the semiconductor die 38 is shown in FIG. 1 as being wire bonded to the leads 22 through the use of the conductive wires, it is also contemplated that a flip chip interconnection method may be employed between the semiconductor die 38 and leads 22 alone or in combination with the die pad 14.

Figure 2:
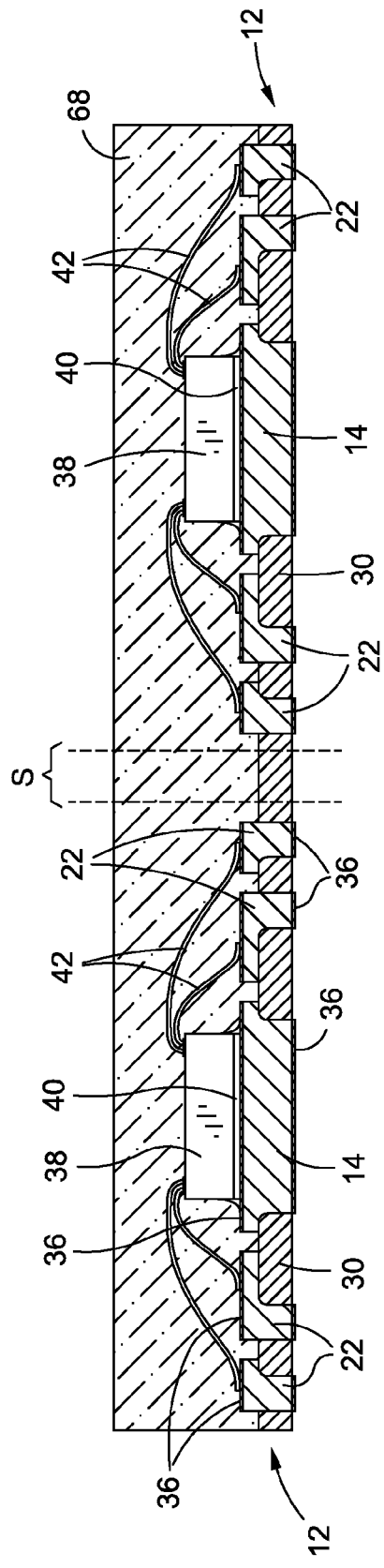
FIG. 2 shows a pair of the assembled semiconductor packages including the substrate of the first embodiment prior to saw singulation.

Referring now to FIG. 2, it is contemplated that a manufacturing process may be implemented wherein multiple semiconductor packages 10 are simultaneously fabricated. More particularly, it is contemplated that a large leadframe strip 50 may be provided, with the aforementioned masking, etching and dielectric material filling steps being completed such that the strip 50 defines substrate "units" which are interconnected by portions of the hardened dielectric material filled into the recesses 60 etched into the bottom surface 54 of the strip 50. Each of the "units" includes one die pad 14 and the corresponding leads 22 which will ultimately be included in the substrate 12 of a single semiconductor package 10. A semiconductor die 38 may be attached to the die pad 14 of each such substrate unit, and electrically connected to the corresponding leads 22 thereof through the use of the conductive wires 42.

Thereafter, as also seen in FIG. 2, a mold cap 68 is formed over the interconnected substrate units, such mold cap 68 covering or encapsulating each of the semiconductor dies 38 and corresponding conductive wires 42. The ultimate formation of individual semiconductor packages 10 is facilitated by singulating or sawing the mold cap 68 and the hardened dielectric material of the interconnected substrate units along prescribed saw streets, one such exemplary saw street S being shown in FIG. 2. The sawing process is usually conducted with diamond type abrasive saw blades. The singulation along these saw streets effectively facilitate the formation of the separate substrates 12 and corresponding package bodies 44 of each semiconductor package 10. Advantageously, each saw street S or sawing path contains no metal for saw blades to cut through. This allows a much faster cutting speed with lower blade wear and results in lower singulation cost. Because the die pad 14 and leads 22 of each substrate unit included in the strip 50 are electrically isolated in the strip 50, it is possible to electrically test such individual substrate units in combination with the corresponding semiconductor dies 38 and conductive wires 42 prior to the completion of the aforementioned singulation process. In this case, electrical testing may be performed in strip form, with the units within the strip being marked using a laser marker. Typically, the good units are marked and the failing are not marked, which serves as a means of identifying good units from bad units in the strip. As indicated above, the end result of the singulation process is the formation of individual semiconductor packages 10, one of which is shown in FIG. 1.

Figure 4:
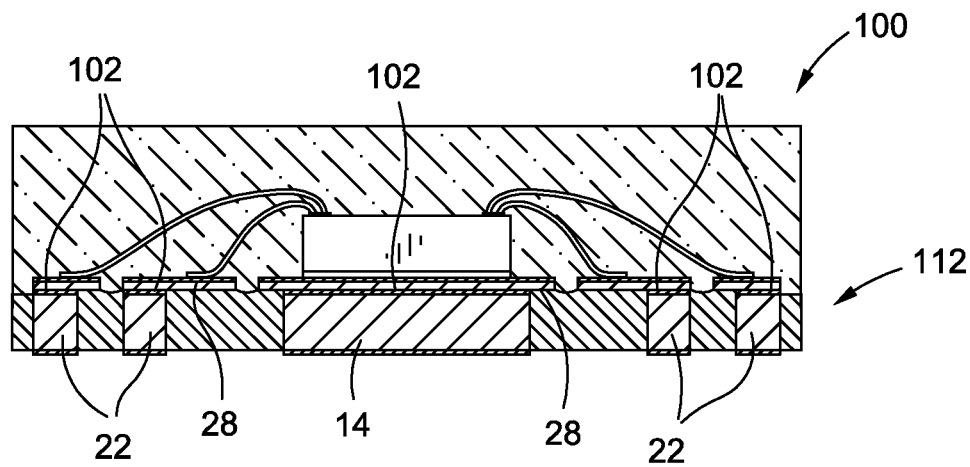
FIG. 4 shows an assembled and singulated semiconductor package including a routable substrate constructed in accordance with a second embodiment of the present invention.

Referring now to FIG. 4, there is shown a semiconductor package 100 constructed in accordance with a second embodiment of the present invention. The semiconductor package 100 is substantially identical in structure to the above-described semiconductor package 10, with only the distinctions between the semiconductor packages 100, 10 being described below.

The sole distinction between the semiconductor packages 100, 10 lies in the die pad 14 and each of the leads 22 included in the substrate 112 of the semiconductor package 100 being formed to include an internal, intermediate layer 102. As will be described in more detail below, the intermediate layer 102 included in the die pad 14 and each of the leads 22 of the substrate 112 is an artifact of the fabrication process implemented in relation thereto. In an exemplary embodiment of the semiconductor package 100, each intermediate layer 102 is fabricated from nickel, with the remainder of the die pad 14 or each lead 22 being fabricated from a copper or copper alloy material.

Having thus described the structural attributes of the semiconductor package 100 shown in FIG. 4, a preferred method of fabricating the substrate 112 thereof will now be described with specific reference to FIGS. 5A-5G.

In the initial step of the fabrication process for the substrate 112, a starting leadframe strip 50 is provided, the strip 50 preferably being fabricated from copper, copper alloy, or any other commonly used metal alloys for leadframes. When viewed from the perspective shown in FIG. 5A, the strip 50 defines a generally planar top surface 52, and an opposed, generally planar bottom surface 54. An intermediate layer 102 which is preferably fabricated from nickel is applied to the top surface 52 of the strip 50. Thereafter, a thin top layer 104 which is also preferably fabricated from copper or copper alloy is applied to the intermediate layer 102. When viewed from the perspective shown in FIG. 5A, the top layer 104 defines a generally planar top surface 106. An etch resistant mask 56 is applied to the top surface 106 of the top layer 104, with a photoimagable etch mask 58 being applied to the bottom surface 54 of the strip 50. The mask 56 completely protects the entire top surface 106 of the top layer 104 from a subsequent etching step described below. The mask 58 is imaged and developed to facilitate the formation of a bottom land pattern which will ultimately be defined by the bottom surface 18 of the die pad 14 and the bottom surfaces 26 of the leads 22 of the substrate 112. The top etch resistant mask 56 is not required to be photosensitive as the top lead pattern of the substrate 112 is not defined until a subsequent fabrication step also described below. As is apparent from FIG. 5A, as a result of the photoimagable etch mask 58 being imaged and developed, openings are formed therein, with those areas of the bottom surface 54 of the strip 50 still covered by the mask 58 ultimately defining the bottom surface 18 of the die pad 14 and the bottom surfaces 26 of the leads 22 in the substrate 112 as indicated above.

In the next step of the fabrication process for the substrate 112 shown in FIG. 5B, a single side etching of the bottom surface 54 of the strip 50 within the openings defined by the imaged and developed etch mask 58 is performed to facilitate the creation of prescribed half etch areas or recesses 60 in the bottom surface 54 of the strip 50. Each of the recesses 60 extends to the intermediate layer 102. Due to the strip 50 preferably being made of copper and the intermediate layer 102 preferably being made of nickel, this etching process is completed using an etchant which is selective to removing copper but not nickel. FIG. 5B shows the resulting half etch areas or recesses 60 that result from the completion of the this initial etching step, the pattern of such recesses 60 being attributable to the aforementioned openings in the bottom etch mask 58.

In the next step of the fabrication process for the substrate 112 shown in FIG. 5C, a second etching process is completed upon those portions of the intermediate layer 102 which are exposed in the recesses 60. As seen in FIG. 5C, the completion of this second etching step results in each of the recesses 60 extending to the bottom surface of the top layer 104. Due to the intermediate layer 102 preferably being made of nickel and the top layer 104 preferably being made of copper, this second etching process is completed using an etchant which is selective to removing nickel but not copper.

In the next step of the fabrication process for the substrate 112 shown in FIG. 5D, the etch resistant mask 56 is removed from the top layer 104 and the photoimagable etch mask 58 is removed from the strip 50. Thereafter, the etched areas or recesses 60 formed in the strip 50 and the intermediate layer 102 as a result of the aforementioned first and second etching processes are filled with a dielectric material (e.g., an epoxy material) which ultimately hardens into the above-described substrate body 30. By way of example and not by way of limitation, transfer molding using standard thermoset mold compounds may be used to facilitate the filling of the recesses 60 with the dielectric material. Other suitable methods for facilitating the filling of the recesses 60 with the dielectric material include screening, or the use of vacuum laminated film. The dielectric material filled into the recesses 60 bonds to the etched surfaces defining the same and, upon hardening into the substrate body 30, will ultimately provide a stable structure to support the die pad 14 and the leads 22 of the completed substrate 112. As is further apparent from FIG. 5C, the dielectric material is filled into the recesses 60 to a depth such that, upon the hardening thereof into the substrate body 30, the bottom surface 34 of the substrate body 30 extends in generally co-planar relation to those portions of the bottom surface 54 of the strip 50 previously covered by the etch mask 58. As will be recognized by those of ordinary skill in the art, the removal of the masks 56, 58 and hardening of the dielectric material filled into the recesses 60 into the substrate body 30 results in the exposed, unetched portions of the bottom surface 54 of the strip 50 defining what will ultimately become the bottom surface 18 of the die pad 14 and bottom surfaces 26 of the leads 22 of the substrate 112. Though not shown, it is contemplated that following the molding step described above, additional steps may be used to facilitate the removal of any mold flash from upon the unetched portions of the bottom surface 54 of the strip 50. Such mold flash removal methods may involve the use of mechanical or chemical techniques, or a combination of both, as are well known in the art.

Referring now to FIG. 5E, in the next step of the fabrication process for the substrate 12, a photoimagable etch mask 62 is applied to the unetched top surface 106 of the top layer 104. An etch resistant mask 64 is applied to the bottom surface 34 of the substrate body 30, and to the unetched portions of the bottom surface 54 of the strip 50. The top mask 62 is imaged and developed in a pattern as will ultimately facilitate the formation of the die pad 14 and leads 22 of the substrate 112 in a desired arrangement. As is apparent from FIG. 5E, as a result of the mask 62 being imaged and developed, openings are formed therein, with those areas of the top surface 106 of the top layer 104 still covered by the imaged and developed mask 62 ultimately defining the top surface 16 of the die pad 14 and the top surfaces 24 of the leads 22 of the substrate 112. The etch resistant mask 64 is used to protect the exposed lands defined by the unetched portions of the bottom surface 54 of the strip 50, and further to protect the bottom surface 34 of the substrate body 30 formed by the hardening of the dielectric material filled into the recesses 60. Advantageously, in the process of fabricating the substrate 112, the bottom pattern formed by the imaging and development of the mask 58 and the top pattern formed by the imaging and development of the mask 62 are independent of each other, allowing for the routing of signal traces as may ultimately be defined by the leads 22 in the completed substrate 112 in a prescribed manner.

In the next step of the fabrication process for the substrate 112 shown in FIG. 5F, a single side etching of the top surface 106 of the top layer 104 within the openings defined by the imaged and developed etch mask 62 is performed, such etching process facilitating the creation of voids or recesses 66 within the top surface 106 of the top layer 104. As seen in FIG. 5F, each of the recesses 66 extends from the top surface 106 of the top layer 104 to the substrate body 30. As is further apparent from FIG. 5F and as will be recognized by those of ordinary skill in the art, the completion of this third etching process in turn facilitates the complete formation of the die pad 14 and leads 22 of the substrate 112.

Referring now to FIG. 5G, in the next step of the fabrication process for the substrate 112, the mask 62 is removed from the now fully formed die pad 14 and leads 22. As will be recognized, the removal of the mask 62 effectively exposes the top surface 16 of the die pad 14 and the top surfaces 24 of the leads 22. In addition to the removal of the mask 62, the etch resistant mask 64 is removed from the bottom surface 34 of the substrate body 30 and the bottom surfaces 18, 26 of the now fully formed die pad 14 and leads 22. Upon the removal of the masks 62, 64, the substrate 112 is cleaned to facilitate the preparation thereof for final plating finish. As will be recognized, upon the completion of the third etching process which effectively facilitates the formation of the die pad 14 and leads 22 of the substrate 112, the substrate body 30 provides the required mechanical support for the die pad 14 and leads 22, thus serving as a stable support structure within the substrate 112. An Electroless Ni/Electroless Pd/Immersion Au plating process (ENEPIG) is then simultaneously performed on both the top surfaces 16, 24 and bottom surfaces 18, 26 of the die pad 14 and leads 22 of the substrate 112. The completion of this process creates the above-described plating layers 36 on the top surfaces 16, 24 and bottom surfaces 18, 26 of the die pad 14 and leads 22. The Ni/Pd/Au plating layers 36 formed on the top surfaces 16, 24 are suitable for wire bonding or flip chip solder reflow attach. The Ni/Pd/Au plating layers 36 formed on the bottom surfaces 18, 26 are suitable for soldering during component mounting.

As is apparent from FIGS. 4 and 5G, due to the manner in which the strip 50 and top layer 104 are etched to facilitate the formation of the recesses 60, 66 therein, the die pad 14 is caused to define the shoulder 20, with each of the leads 22 being caused to define a respective one of the shoulders 28 and thus a trace which, as indicated above, may be configured for routing from one or more leads 22 of the outer set, between leads 22 of the inner set, and toward the die pad 14. Due to the filling of the recesses 60 with the dielectric material prior to the formation of the recesses 66, the shoulders 20, 28 defined as a result of the formation of the recesses 66 are completely covered by the substrate body 30, which assists in maintaining a firm mechanical interlock of the die pad 14 and leads 22 thereto. Thus, in addition to maintaining the die pad 14 and leads 22 in electrical isolation from each other, the substrate body 30 of the substrate 112 provides a stable support structure for the die pad 14 and leads 22.

As will be recognized by those of ordinary skill in the art, once the fabrication of the substrate 112 is completed in accordance with the showing in FIG. 5G, the fabrication of the semiconductor package 100 is facilitated in the same manner described above in relation to the semiconductor package 10. Additionally, though not shown, those of ordinary skill in the art will recognize that multiple semiconductor packages 100 may also be simultaneously fabricated by employing those techniques described above in relation to FIG. 2 regarding the mass production of semiconductor packages 10.

Figure 6:
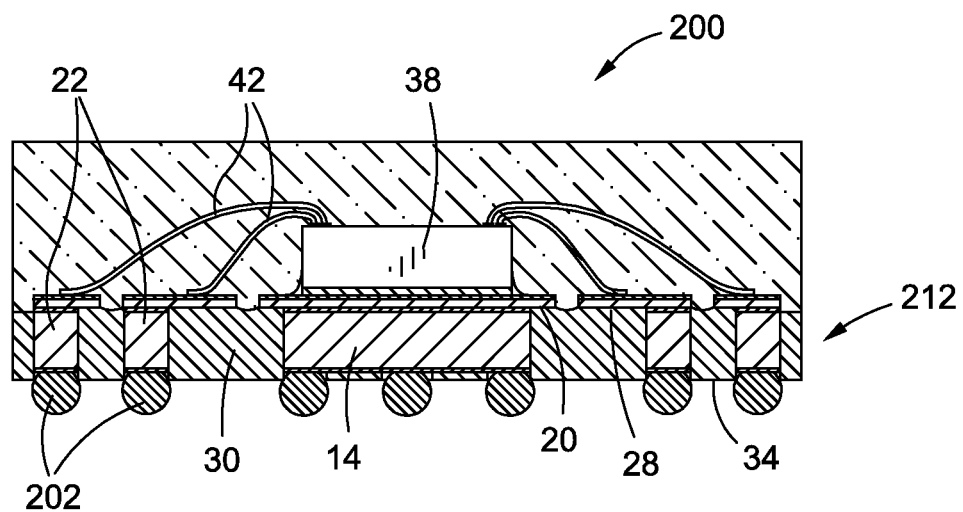
FIG. 6 shows an assembled and singulated semiconductor package including a routable substrate constructed in accordance with a third embodiment of the present invention.

Referring now to FIG. 6, there is shown a semiconductor package 200 constructed in accordance with a third embodiment of the present invention. The semiconductor package 200 is substantially identical in structure to the above-described semiconductor package 100, with only the distinctions between the semiconductor packages 200, 100 being described below.

The sole distinction between the semiconductor packages 200, 100 lies in the bottom surfaces 18, 26 of the die pad 14 and leads 22 included in the substrate 212 of the semiconductor package 200 being slightly recessed relative to the bottom surface 34 of the substrate body 30 of the substrate 212 when viewed from the perspective shown in FIG. 6. As will be described in more detail below, a laser ablation process is conducted on the substrate body 30 of the substrate 212 to facilitate the exposure of the bottom surfaces 18, 26 of the die pad 14 and leads 22 therein. Due to the bottom surfaces 18, 26 being recessed relative to the bottom surface 34 of the substrate body 30 of the substrate 212 in the semiconductor package 200, solder balls 202 are preferably attached to such bottom surfaces 18, 26 in the manner shown in FIG. 6 to facilitate the electrical connection of the semiconductor package 200 to an underlying substrate such as a printed circuit board.

Having thus described the structural attributes of the semiconductor package 200 shown in FIG. 6, a preferred method of fabricating the substrate 212 thereof will now be described with specific reference to FIGS. 7A-7F.

The initial three steps involved with the fabrication of the substrate 212 of the semiconductor package 200 are identical to those steps described above in relation to FIGS. 5A, 5B and 5C regarding the fabrication methodology for the substrate 112. In FIG. 7A, the partially fabricated substrate 212 is shown subsequent to the removal of the etch resistant mask 56 from the top surface 106 of the top layer 104 and the removal of the photoimagable etch mask 58 from the bottom surface 54 of the strip 50, but prior to the filling of the recesses 60 with the dielectric material.

In the next step of the fabrication process for the substrate 212 shown in FIG. 7B, the etched areas or recesses 60 formed in the strip 50 and the intermediate layer 102 as a result of the aforementioned first and second etching processes are filled using a film dielectric material and vacuum lamination process. The hardening of the dielectric material results in the formation of the substrate body 30 of the substrate 212. The implementation of the vacuum lamination process covers the unetched portions of the bottom surface 54 of the strip 50 with the dielectric material (i.e., a portion of the substrate body 30). As will be described in more detail below, an additional step of removing the dielectric material from over the unetched portions of the bottom surface 54 of the strip 50 is required to expose the same. However, the covering of the unetched portions of the bottom surface 54 effectuated by the vacuum lamination process has the advantage of eliminating the need for an additional bottom etch mask application, since the dielectric material or substrate body 30 can serve this purpose.

Referring now to FIG. 7C, in the next step of the fabrication process for the substrate 12, a photoimagable etch mask 62 is applied to the unetched top surface 106 of the top layer 104. The top mask 62 is imaged and developed in a pattern as will ultimately facilitate the formation of the die pad 14 and leads 22 of the substrate 212 in a desired arrangement. As is apparent from FIG. 7C, as a result of the mask 62 being imaged and developed, openings are formed therein, with those areas of the top surface 106 of the top layer 104 still covered by the imaged and developed mask 62 ultimately defining the top surface 16 of the die pad 14 and the top surfaces 24 of the leads 22 of the substrate 212. Advantageously, in the process of fabricating the substrate 212, the bottom pattern formed by the imaging and development of the mask 58 and the top pattern formed by the imaging and development of the mask 62 are independent of each other, allowing for the routing of signal traces as may ultimately be defined by the leads 22 in the completed substrate 212 in a prescribed manner.

In the next step of the fabrication process for the substrate 212 shown in FIG. 7D, a single side etching of the top surface 106 of the top layer 104 within the openings defined by the imaged and developed etch mask 62 is performed, such etching process facilitating the creation of voids or recesses 66 within the top surface 106 of the top layer 104. As seen in FIG. 7E, each of the recesses 66 extends from the top surface 106 of the top layer 104 to the substrate body 30. As is further apparent from FIG. 7D and as will be recognized by those of ordinary skill in the art, the completion of this third etching process in turn facilitates the complete formation of the die pad 14 and leads 22 of the substrate 212. After the completion of the third etching process, the mask 62 is removed from the now fully formed die pad 14 and leads 22. As will be recognized, the removal of the mask 62 effectively exposes the top surface 16 of the die pad 14 and the top surfaces 24 of the leads 22. Upon the removal of the mask 62, the substrate 212 is cleaned to facilitate the preparation thereof for final plating finish.

Referring now to FIG. 7E, in the next step of the fabrication process for the substrate 212, a selective dielectric material removal (i.e., a selected removal of the substrate body 30) is performed through the use of, for example, a laser ablation process. Such laser ablation process is conducted in a manner which effectively removes portions of the dielectric material or substrate body 30 from the bottom surface 18 of the die pad 14 and the bottom surfaces 26 of the leads 22 in the manner shown in FIG. 7E. As previously explained, as a result of such ablation process, the bottom surfaces 18, 26 of the die pad 14 and leads 22 are slightly recessed relative to the bottom surface 34 of the substrate body 30 when viewed from the perspective shown in FIG. 7E.

Referring now to FIG. 7F, in the final step of the fabrication process for the substrate 212, an Electroless Ni/Electroless Pd/Immersion Au plating process (ENEPIG) is then simultaneously performed on both the top surfaces 16, 24 and bottom surfaces 18, 26 of the die pad 14 and leads 22 of the substrate 212. The completion of this process creates the above-described plating layers 36 on the top surfaces 16, 24 and bottom surfaces 18, 26 of the die pad 14 and leads 22. The Ni/Pd/Au plating layers 36 formed on the top surfaces 16, 24 are suitable for wire bonding or flip chip solder reflow attach. The Ni/Pd/Au plating layers 36 formed on the bottom surfaces 18, 26 are suitable for soldering during component mounting.

As is apparent from FIGS. 6 and 7F, due to the manner in which the strip 50 and top layer 104 are etched to facilitate the formation of the recesses 60, 66 therein, the die pad 14 is caused to define the shoulder 20, with each of the leads 22 being caused to define a respective one of the shoulders 28 and thus a trace which, as indicated above, may be configured for routing from one or more leads 22 of the outer set, between leads 22 of the inner set, and toward the die pad 14. Due to the filling of the recesses 60 with the dielectric material prior to the formation of the recesses 66, the shoulders 20, 28 defined as a result of the formation of the recesses 66 are completely covered by the substrate body 30, which assists in maintaining a firm mechanical interlock of the die pad 14 and leads 22 thereto. Thus, in addition to maintaining the die pad 14 and leads 22 in electrical isolation from each other, the substrate body 30 of the substrate 212 provides a stable support structure for the die pad 14 and leads 22.

As will be recognized by those of ordinary skill in the art, once the fabrication of the substrate 212 is completed in accordance with the showing in FIG. 7F, the fabrication of the semiconductor package 200 is facilitated in the same manner described above in relation to the semiconductor package 100. However, the fabrication of the semiconductor package 200 involves the additional step of electrically connecting the solder balls 202 to the bottom surfaces 18, 26 of the die pad 14 and leads 22. Additionally, though not shown, those of ordinary skill in the art will recognize that multiple semiconductor packages 200 may also be simultaneously fabricated by employing those techniques described above in relation to FIG. 2 regarding the mass production of semiconductor packages 10.

As is apparent from FIGS. 1, 4 and 6, a notable distinction between the semiconductor packages 10, 100, 200 arising from the processes involved in the fabrication of the substrates 12, 112, 212 included therein lies in the thicknesses of certain portions of the die pad 14 and leads 22. More particularly, in the substrate 12 of the semiconductor package 10, the thickness of the die pad 14 between the top surface 16 and shoulder 20 and the thicknesses of the leads 22 between the top surfaces 24 and shoulders 28 substantially exceeds the same such thicknesses in the die pad 14 and leads 22 included in the substrates 112, 212 of the semiconductor packages 100, 200. The thinner profile of the die pad 14 and leads 22 in the substrate 112, 212 results in finer lines and spacing, such thinner profiles being a result of the more controlled etching attributable to the inclusion of the Ni—Cu layers on top of the base Cu layer described as part of the fabrication methodologies related to the substrates 112, 212.

Importantly, each embodiment of the substrate 12, 112, 212 constructed in accordance with the present invention provides routing capability without the need for PTH vias, and further effectively maintains DFN/QFN pad structure for thermal efficiency. Further, the fabrication process employed in relation to the substrate 12, 112, 212 eliminates the need for sacrificial carriers. Moreover, by utilizing ENEPIG (electroless) plating, the buss structure for electrolytic plating is eliminated, which in turn eliminates metal from the saw cut streets for package isolation as explained above.

Figure 8:
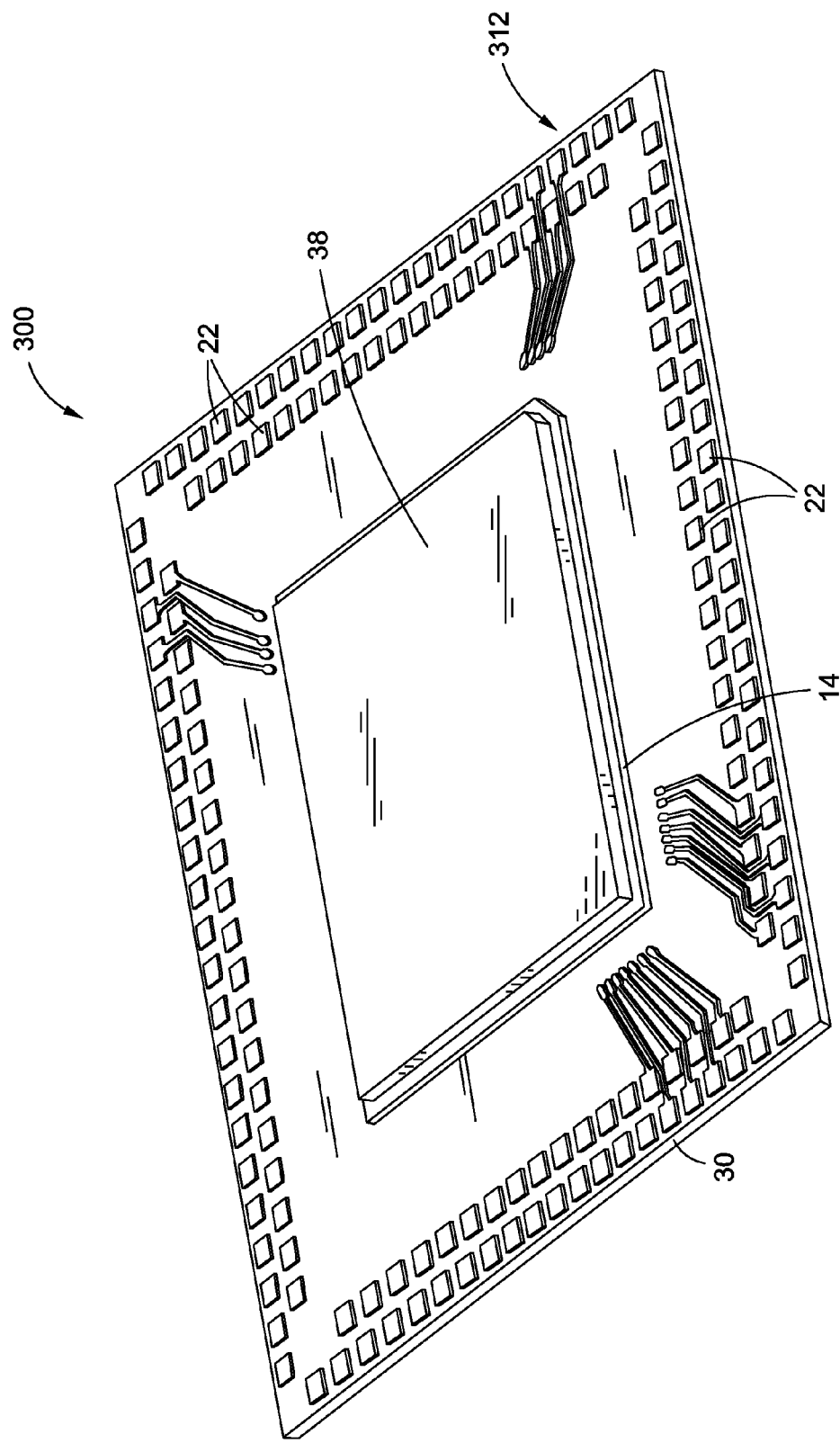
FIG. 8 shows an assembled and singulated semiconductor package including a routable substrate constructed in accordance with a fourth embodiment of the present invention, the package body being omitted from the semiconductor package for purposes of clearly depicting certain other features thereof.

Referring now to FIG. 8, there is shown a semiconductor package 300 constructed in accordance with a fourth embodiment of the present invention. The semiconductor package 300 is substantially similar in structure to the above-described semiconductor package 10, with only the distinctions between the semiconductor packages 300, 10 being described below. In FIG. 8, the package body corresponding to the package body 44 shown in FIG. 1 in relation to the semiconductor package 10 is omitted from the semiconductor package 300 for purposes of clearly depicting certain other features thereof, and most notably the substrate 312. The conductive wires 42 shown in FIG. 1 are also omitted in FIG. 8 for purposes of clarity.

As explained above, it is contemplated that the substrate 12 of the semiconductor package 10 may be configured such that the portion of each of the leads 22 defining the shoulder 28 may serve as a trace for routing purposes, with the traces of one or more leads 22 of the outer set optionally being configured such that they may be used to route from the outer set, between leads 22 of the inner set, and toward the die pad 14. The substrate 312 of the semiconductor package 300 shown in FIG. 8 has this particular configuration, i.e., portions of at least some of the leads 22 of the outer set are formed to define a trace which extends between an adjacent pair of leads 22 of the inner set, the traces of the outer leads 22 thus being capable of routing from the outer set, between leads 22 of the inner set, and toward the die pad 14. However, in the substrate 312 shown in FIG. 8, portions of at least some of the leads 22 of the inner set also define a trace which is used for routing from such inner leads 22 toward the die pad 14. As is apparent from FIG. 8, the traces defined by the leads 22 of the outer set are not identically configured to each other. Similarly, the traces defined by the leads 22 of the inner set are not identically configured to each other, or to those of the leads 22 of the outer set. In this regard, it is contemplated that the leads 22 may be formed such that the traces defined thereby are provided in any shape, number, pattern or arrangement as needed to satisfy a prescribed application. Additionally, it should be noted that in FIG. 8, only certain exemplary leads 22 are shown as defining an elongate trace extending toward the die pad 14. However, as indicated above, it will recognized that one or more leads 22 of the inner and/or outer sets thereof may be formed to define traces in any shape, number, pattern or arrangement.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of fabricating a substrate for a semiconductor package, comprising the steps of:
   a) providing a conductive metal strip having opposed top and bottom surfaces;
   b) etching the bottom surface of the strip to form recesses in the bottom surface which are arranged in a first prescribed pattern and are each of a prescribed depth;
   c) filling the recesses with a dielectric material which hardens into a substrate body of the substrate; and
   d) etching the top surface of the strip to form recesses in the top surface which are arranged in a second prescribed pattern and extend to the substrate body;
   wherein steps (b) and (d) are completed in a manner facilitating the formation within the substrate of a die pad having opposed top and bottom pad surfaces, a plurality of leads which each have opposed top and bottom lead surfaces, and a saw path containing no metal.

2. The method of claim 1 wherein step (a) further comprises:
   1) applying an etch resistant mask to the top surface of the strip, and a photoimagable etch mask to the bottom surface of the strip; and
   2) imaging and developing the photoimagable etch mask in a manner creating a plurality of openings therein to provide the first prescribed pattern;
   step (b) being completed by applying an etchant to the bottom surface of the strip through the plurality of openings within the photoimagable etch mask.

3. The method of claim 2 wherein step (c) comprises removing the etch resistant mask from the top surface and the photoimagable etch mask from the bottom surface prior to filling the recesses with the dielectric material.

4. The method of claim 3 wherein step (c) comprises filling the recesses with the dielectric material such the substrate body defines a bottom body surface which extends in substantially flush relation to the bottom surface of the strip.

5. The method of claim 4 wherein step (d) further comprises:
   1) applying an etch resistant mask to the bottom surface of the strip and the bottom body surface of the substrate body, and a photoimagable etch mask to the top surface of the strip; and
   2) imaging and developing the photoimagable etch mask in a manner creating a plurality of openings therein to provide the second prescribed pattern;
   step (d) being completed by applying an etchant to the top surface of the strip through the plurality openings within the photoimagable etch mask.

6. The method of claim 5 further comprising the step of:
   e) removing the etch resistant mask from the bottom body surface of the substrate body, the bottom pad surface of the die pad, and the bottom lead surfaces of the leads, and removing the photoimagable etch mask from the top pad surface of the die pad and the top lead surfaces of the leads.

7. The method of claim 1 wherein steps (b) and (d) are completed in a manner such that the die pad and each of the leads defines a shoulder which overlaps onto and is covered by the substrate body.

8. The method of claim 1 wherein steps (b) and (d) are completed in a manner to form at least one lead having an elongated trace that overlaps onto the substrate body and extends beyond the bottom lead surface of the least one lead toward the die pad.

9. A semiconductor package, comprising:
a substrate comprising a die pad and a plurality of leads at least partially embedded in a substrate body, at least some of the leads overlapping onto the substrate body to define elongated traces that extend toward the die pad;
a semiconductor die attached to the die pad and electrically connected to at least some of the leads;
a package body covering at least portions of the semiconductor die and the substrate such that the traces of the leads are covered by the package body, and portions of each of the leads which are exposed in the substrate are not covered by the package body, and wherein the leads of the substrate are segregated into an inner set which at least partially circumvents the die pad and an outer set which at least partially circumvents the inner set, at least some of the leads of the outer set including a trace which extends toward the die pad between an adjacent pair of the leads of the inner set.

10. A method of fabricating a substrate for a semiconductor package, comprising the steps of:
a) providing a conductive strip having opposed top and bottom surfaces;
b) etching the bottom surface of the strip to form recesses in the bottom surface which are arranged in a first prescribed pattern and each extend to a prescribed portion thereof;
c) filling the recesses with a dielectric material which hardens into a substrate body of the substrate; and
d) etching the top surface of the strip to form recesses in the top surface which are arranged in a second prescribed pattern and extend to the substrate body;
wherein steps (b) and (d) are completed in a manner facilitating the formation within the substrate of a die pad having opposed top and bottom pad surfaces and a plurality of leads including sets of inner and outer leads, each lead having opposed top and bottom lead surfaces, and wherein at least some of the inner and outer leads have shoulders with different lengths, and wherein the shoulders are covered by the substrate body.

11. The method of claim 10 wherein:
step (a) comprises providing a conductive strip having an intermediate layer and a top layer which is formed on the intermediate layer and defines the top surface;
step (b) comprises:
1) etching the bottom surface of the strip to form recesses in the bottom surface which are arranged in a prescribed pattern and each extend to the intermediate layer; and
2) etching portions of the intermediate layer exposed in the recesses such that the recesses each extend to the top layer;

step (d) comprises etching the top surface defined by the top layer to form recesses in the top surface which are arranged in a prescribed pattern and extend to the substrate body.

12. The method of claim 11 wherein step (a) further comprises:
1) applying an etch resistant mask to the top surface defined by the top layer, and a photoimagable etch mask to the bottom surface of the strip; and
2) imaging and developing the photoimagable etch mask in a manner creating a plurality of openings therein in a prescribed pattern;
step (b) being completed by applying an etchant to the bottom surface of the strip through the openings within the photoimagable etch mask.

13. The method of claim 12 wherein step (c) comprises removing the etch resistant mask from the top surface defined by the top layer and the photoimagable etch mask from the bottom surface of the strip prior to filling the recesses with the dielectric material.

14. The method of claim 13 wherein step (2) comprises filling the recesses with the dielectric material such the substrate body defines a bottom body surface which extends in substantially flush relation to the bottom surface of the strip.

15. The method of claim 14 wherein step (d) further comprises:
1) applying an etch resistant mask to the bottom surface of the strip and the bottom body surface of the substrate body, and a photoimagable etch mask to the top surface defined by the top layer; and
2) imaging and developing the photoimagable etch mask in a manner creating a plurality of openings therein in a prescribed pattern;
step (d) being completed by applying an etchant to the top surface defined by the top layer through the openings within the photoimagable etch mask.

16. The method of claim 15 further comprising the step of:
e) removing the etch resistant mask from the bottom body surface of the substrate body, the bottom pad surface of the die pad, and the bottom lead surfaces of the leads, and removing the photoimagable etch mask from the top pad surface of the die pad and the top lead surfaces of the leads.

17. The method of claim 13 wherein:
step (c) further comprises applying the dielectric material to the bottom surface of the strip such the substrate body covers the bottom surface of the strip; and
step (d) further comprises:
1) applying a photoimagable etch mask to the top surface defined by the top layer; and
2) imaging and developing the photoimagable etch mask in a manner creating a plurality of openings therein in a prescribed pattern;
step (d) being completed by applying an etchant to the top surface of the top layer through the openings within the photoimagable etch mask.

18. The method of claim 10 wherein steps (b) and (d) are completed in a manner such that the die pad and each of the leads defines a shoulder which is covered by the substrate body.

19. The method of claim 18 further comprising the step of:
f) ablating portions of the substrate body in a manner exposing the bottom pad surface of the die pad and the bottom lead surfaces of the leads therein.

* * * * *